(12) United States Patent
Noujaim et al.

(10) Patent No.: US 12,444,585 B2
(45) Date of Patent: Oct. 14, 2025

(54) ELECTRICAL CONNECTOR FOR COOLED SUBSTRATE SUPPORT ASSEMBLY

(71) Applicant: Applied Materials, Inc., Santa Clara, CA (US)

(72) Inventors: Andrew Antoine Noujaim, Morgan Hill, CA (US); Álvaro García De Gorordo, Mountain View, CA (US); Andreas Schmid, Meyriez (CH); Stephen Donald Prouty, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 686 days.

(21) Appl. No.: 16/887,596

(22) Filed: May 29, 2020

(65) Prior Publication Data

US 2021/0375599 A1 Dec. 2, 2021

(51) Int. Cl.
*H01J 37/32* (2006.01)
*H01L 21/67* (2006.01)
*H01L 21/683* (2006.01)

(52) U.S. Cl.
CPC .. *H01J 37/32724* (2013.01); *H01L 21/67109* (2013.01); *H01L 21/6833* (2013.01)

(58) Field of Classification Search
CPC .......... C23C 16/4586; C23C 16/67109; C23C 16/6833; H01J 37/32724; H01J 37/32577; H01R 9/11
See application file for complete search history.

(56) References Cited

U.S. PATENT DOCUMENTS

| | | | | |
|---|---|---|---|---|
| 4,725,693 A | * | 2/1988 | Hirsch | B32B 7/14 174/106 SC |
| 5,376,755 A | * | 12/1994 | Negm | H01B 12/02 505/231 |
| 5,817,406 A | * | 10/1998 | Cheung | C23C 16/4586 219/385 |
| 6,151,203 A | * | 11/2000 | Shamouilian | H01L 21/6833 361/234 |
| 6,558,508 B1 | | 5/2003 | Kawakami | |
| 6,949,722 B2 | | 9/2005 | Strang et al. | |
| 7,161,121 B1 | | 1/2007 | Steger | |
| 7,230,204 B2 | | 6/2007 | Mitrovic et al. | |
| 7,651,583 B2 | | 1/2010 | Kent et al. | |
| 8,007,591 B2 | | 8/2011 | Hamelin | |

(Continued)

*Primary Examiner* — Keath T Chen
(74) *Attorney, Agent, or Firm* — Patterson + Sheridan, LLP (57) ABSTRACT

An electrical connector for a substrate support assembly is disclosed herein. The electrical connector includes a first interface body, and a second interface body coupled to the first interface body and to a third interface body. The second interface body is circumscribed by the third interface body. The first interface body and the second interface body each comprise a plurality of electrical terminals disposed in sockets formed in the respective first and second interface bodies, each electrical terminal disposed in sockets of the first interface body coupled to a respective one of the electrical terminals disposed in sockets of the second interface body to form a plurality of isolated conductive electrical unions, wherein the second interface body includes a plurality of protruding sidewalls that extend into the first interface body between each of the electrical terminals of the first interface body.

20 Claims, 5 Drawing Sheets

(56) References Cited

U.S. PATENT DOCUMENTS

| | | |
|---|---|---|
| 9,779,955 B2 | 10/2017 | Lill et al. |
| 10,283,398 B2 | 5/2019 | Tanaka et al. |
| 2002/0014894 A1 | 2/2002 | Yonezawa et al. |
| 2008/0217293 A1 | 9/2008 | Iimuro |
| 2009/0314208 A1* | 12/2009 | Zhou ................. H01L 21/67103 |
| | | 118/723 R |
| 2010/0122774 A1 | 5/2010 | Makabe et al. |
| 2013/0128409 A1* | 5/2013 | Nam ................. H01J 37/32715 |
| | | 361/234 |
| 2014/0087587 A1* | 3/2014 | Lind ................. H01J 37/32532 |
| | | 439/527 |
| 2014/0238637 A1* | 8/2014 | Tanaka ................. H01J 37/3171 |
| | | 165/47 |
| 2015/0214653 A1* | 7/2015 | Sakane ............... C23C 16/4586 |
| | | 439/190 |
| 2016/0079107 A1* | 3/2016 | Aramaki ........... H01J 37/32715 |
| | | 156/345.51 |
| 2017/0372911 A1 | 12/2017 | Lill et al. |
| 2018/0076048 A1 | 3/2018 | Gohira et al. |
| 2018/0160567 A1* | 6/2018 | Williams ........... H05K 7/20272 |
| 2018/0197761 A1 | 7/2018 | Ferrara et al. |
| 2018/0211822 A1 | 7/2018 | Gohira et al. |
| 2018/0211924 A1 | 7/2018 | Andry et al. |
| 2018/0301837 A1* | 10/2018 | Hoyack ............. H01R 12/7082 |
| 2018/0350561 A1 | 12/2018 | Yamaguchi et al. |
| 2019/0027345 A1 | 1/2019 | Ishikawa et al. |
| 2019/0035609 A1 | 1/2019 | Tobe |
| 2019/0088521 A1* | 3/2019 | Chua ................. H01L 21/6833 |

\* cited by examiner

ELECTRICAL CONNECTOR FOR COOLED SUBSTRATE SUPPORT ASSEMBLY

BACKGROUND

Field

Embodiments of the present disclosure generally relate to semiconductor chamber components, and more particularly to an electrical connector for a cooled substrate support assembly for use in high frequency electric fields.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufacturers demand higher throughput and better device yield and performance from every silicon substrate processed. Some fabrication techniques being explored for next generation devices under current development require processing at cryogenic temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Operating a substrate support assembly at cryogenic temperatures creates challenges. For example, expansion and contraction between layers of the substrate support assembly can cause leakage of fluids and/or vacuum leaks. These challenges extend to providing electrical connections to heaters and/or voltage for chucking within or on the substrate support assembly. In addition, arcing within the substrate support assembly can lead to many problems.

Thus, there is a need for an improved substrate support assembly.

SUMMARY

A substrate support assembly is described herein that includes an electrical connector for use at cryogenic temperatures.

In one embodiment, an electrical connector for a substrate support assembly is disclosed herein. The electrical connector includes a first interface body, and a second interface body coupled to the first interface body and to a third interface body. The second interface body is circumscribed by the third interface body. Each of the first interface body and the second interface body comprise a plurality of electrical terminals disposed in sockets formed in the respective first and second interface bodies, each electrical terminal disposed in sockets of the first interface body coupled to a respective one of the electrical terminals disposed in sockets of the second interface body to form a plurality of isolated conductive electrical unions, wherein the second interface body includes a plurality of protruding sidewalls that extend into the first interface body between each of the electrical terminals of the first interface body, and wherein the third interface body includes a seal groove formed in a bottom surface thereof that faces away from the first interface body.

In another embodiment, a substrate support assembly is described that includes an electrostatic chuck, a base assembly coupled to the electrostatic chuck, a facility plate coupled to the base assembly, and an electrical connector positioned in a center of the base assembly in electrical communication with the electrostatic chuck. The electrical connector comprises a first interface body comprising a first dielectric material; and a second interface body comprising a second dielectric material different than the first dielectric material, the second interface body coupled to the first interface body and circumscribed by a third interface body. Each of the first interface body and the second interface body comprise a plurality of electrical terminals disposed in sockets formed in the respective first and second interface bodies, each of the plurality of electrical terminals coupled together by a plurality of conductive electrical unions formed in the third interface body and portions of the sockets.

In another embodiment, a substrate support assembly is described herein that includes an electrostatic chuck having a chucking electrode and a plurality of heaters, a base assembly coupled to the electrostatic chuck, a facility plate coupled to the base assembly, and an electrical connector coupled to the facility plate in electrical communication with the electrostatic chuck. The electrical connector comprises a first interface body, and a second interface body coupled to the first interface body by a third interface body. Each of the first interface body and the second interface body comprise a plurality of electrical terminals disposed in sockets formed in the respective first and second interface bodies. Each of the plurality of electrical terminals is coupled together by a conductive electrical union formed in the third interface body and portions of the sockets. The second interface body includes a plurality of protruding sidewalls that extend into the first interface body between each of the electrical terminals, and wherein the third interface body includes an O-ring groove formed in a bottom surface thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The cryogenic processing temperature (i.e., temperature of the substrate) is intended to refer to temperatures less than −10 degrees Celsius at the substrate support.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing a substrate maintained at the cryogenic processing temperature is desirable. It is to be noted however, that the substrate support assemblies and chamber components described herein may be utilized to advantage at other processing temperatures.

Figure 1:
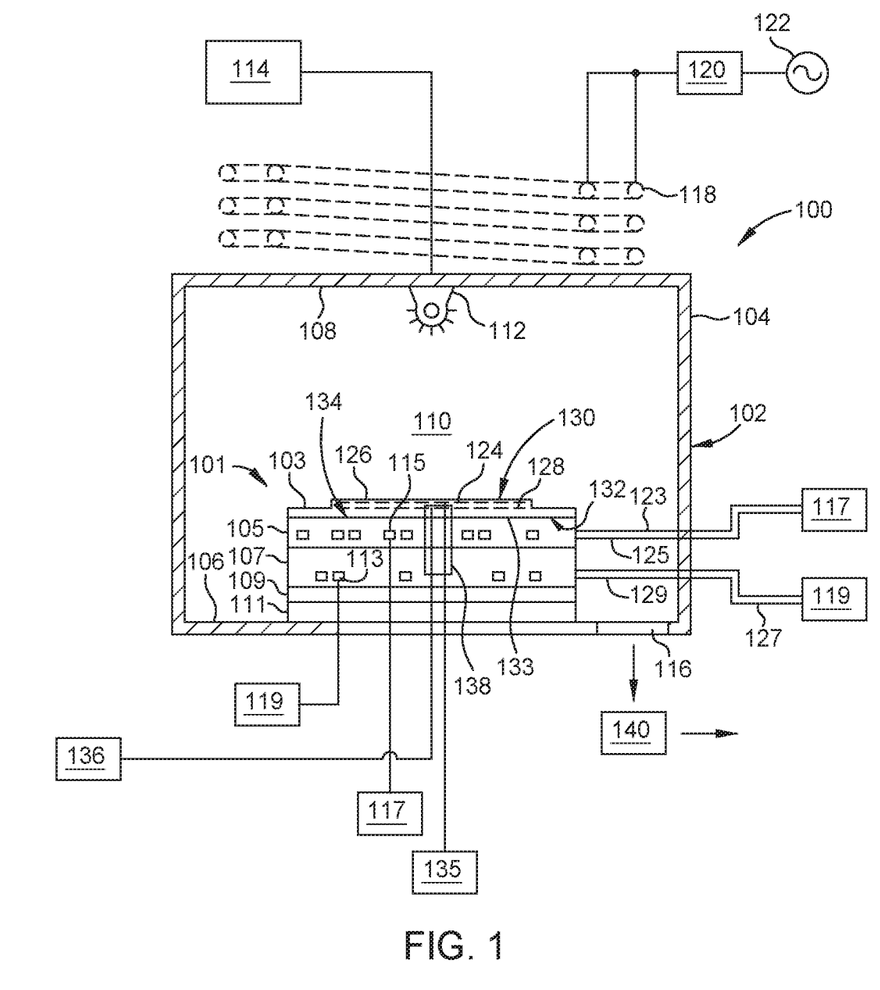
FIG. 1 is a cross-sectional schematic view of an exemplary plasma processing chamber according to an embodiment.

FIG. 1 is a cross-sectional schematic view of an exemplary plasma processing chamber 100, shown configured as an etch chamber, having a substrate support assembly 101. As mentioned above, the substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface of a workpiece, such as a substrate 124, at a cryogenic processing temperature is desirable. Dry reactive ion etching the substrate 124 maintained at a cryogenic processing temperature enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at the cryogenic processing temperature is decreased while ions continue to bombard the upward facing surface of the low-k dielectric material to form trenches with smooth, vertical sidewalls. Additionally, selectivity of etching one material versus another can be improved at the cryogenic processing temperature. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110. Processing by-products are also removed through the exhaust port 116 using the pumping system 140.

The process gases may be energized to form a plasma within the processing region 110. The process gases may be energized by capacitively or inductively coupling RF power to the process gases. In one embodiment, which can be combined with other embodiments described herein, depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an electrostatic chuck (ESC) 103 and an ESC base assembly 105. The ESC base assembly 105 is coupled to the ESC 103 and a facility plate 107. The facility plate 107, supported by a ground plate 111, is configured to facilitate electrical, cooling, heating, and gas connections with the substrate support assembly 101. The ground plate 111 is supported by the bottom 106 of the processing chamber. A dielectric plate 109 electrically insulates the facility plate 107 from the ground plate 111.

The ESC base assembly 105 includes a base channel 115 fluidly coupled to a cryogenic chiller 117. The cryogenic chiller 117 provides a base fluid, such as a refrigerant, to the base channel 115 so that the ESC base assembly 105, and consequently, the substrate 124, may be maintained at a predetermined cryogenic temperature. Similarly, the facility plate 107 includes a facility channel 113 (further detailed in FIG. 2) fluidly coupled to a heating fluid source 119. The heating fluid source 119 provides facility fluid to the facility channel 113 so that the facility plate 107 is maintained a predetermined temperature. The heating fluid source 119 contains a heat exchange fluid that maintains the facility plate 107 at a temperature at or near ambient temperatures. In one example, the base fluid from the cryogenic chiller 117 maintains the ESC base assembly 105 at a temperature lower than a temperature of the facility plate 107.

The heating fluid source 119 is in fluid communication with the facility channel 113 via a facility inlet conduit 127 connected to an inlet (not shown) of the facility channel 113 and via a facility outlet conduit 129 connected to an outlet (not shown) of the facility channel 113 such that the facility plate 107 is maintained at a predetermined ambient temperature. The heat exchange fluid may include a material that can maintain an ambient temperature between about −10 degrees Celsius to about 60 degrees Celsius. The heating fluid source 119 provides the heat exchange fluid, which is circulated through the facility channel 113 of the facility plate 107. The heat exchange fluid is generally dielectric or electrically insulative so that an electrical path is not formed through the heat exchange fluid when circulated through the substrate support assembly 101. A non-limiting example of a suitable facility fluid includes fluorinated heat transfer fluids such as perfluoropolyether (PFPE) fluids. The heat exchange fluid flowing through the facility channel 113 enables the facility plate 107 to be maintained at the predetermined ambient temperature, which assists in maintaining the dielectric plate 109 at the predetermined ambient temperature.

The ESC 103 has a support surface 130 and a bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternatively, the ESC 103 may be fabricated from a polymer, such as polyimide, polyetheretherketone, polyaryletherketone and the like.

A bond layer 133 is provided at an interface between the bottom surface 132 of the ESC 103 and a top surface 134 of the ESC base assembly 105. The ESC 103 may be made of alumina ($Al_2O_3$) or aluminum nitride (AlN). The ESC base assembly 105 may be made of aluminum (Al), molybdenum (Mo), a ceramic, or combinations thereof. The bond layer 133 allows strain to be absorbed due to small differences in the CTE of the ESC 103 and ESC base assembly 105 from temperatures of about 90 degrees Celsius to about −200 degrees Celsius during operation.

The ESC 103 includes a chucking electrode 126 disposed therein. The chucking electrode 126 may be configured as a mono polar or bipolar electrode, or other suitable arrangement. The chucking electrode 126 is coupled through an RF filter and the facility plate 107 to a chucking power source 135, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein.

The resistive heaters 128 are utilized to control the temperature of the ESC 103, which is cooled by the ESC base assembly 105, such that cryogenic processing temperatures suitable for processing a substrate 124 disposed on the support surface 130 of the substrate support assembly 101 may be maintained. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 124 to a predetermined cryogenic temperature. In one embodiment, which can be combined with other embodiments described herein, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 124 at a cryogenic processing temperature suitable for processing. In one embodiment, which can be combined with other embodiments described herein, the cryogenic processing temperature is less than about −10 degrees Celsius. For example, the cryogenic processing temperature is between about −10 degrees Celsius to about −150 degrees Celsius, including down to about −200 degrees Celsius.

Power to the resistive heaters 128 and the ESC 103 from the heater power source 136 and the chucking power source 135, respectively, is provided by an electrical feedthrough or electrical connector 138. The electrical connector 138 is described in more detail below.

The cryogenic chiller 117 is in fluid communication with the base channel 115 via a base inlet conduit 123 connected to an inlet 254 (FIG. 2) of the base channel 115 and via a base outlet conduit 125 connected to an outlet 256 (FIG. 2) of the base channel 115 such that the ESC base assembly 105 is maintained at a predetermined cryogenic temperature. In one embodiment, which can be combined with other embodiments described herein, the cryogenic chiller 117 contains a base fluid. The base fluid comprises a composition that remains a liquid a cryogenic temperature less than −50 degrees Celsius at operating pressures. The base fluid is generally dielectric or electrically insulative so that an electrical path is not formed through the base fluid when circulated through the substrate support assembly 101. A non-limiting example of suitable base fluid includes fluorinated heat transfer fluids. The cryogenic chiller 117 provides the base fluid, which is circulated through the base channel 115 of the ESC base assembly 105. The base fluid flowing through the base channel 115 enables the ESC base assembly 105 to be maintained at the cryogenic temperature, which assists in controlling the lateral temperature profile of the ESC 103 so that the substrate 124 disposed on the ESC 103 is uniformly maintained at the cryogenic processing temperature. In one embodiment, which can be combined in other embodiments described herein, the cryogenic chiller 117 is a single-stage chiller operable to maintain the cryogenic temperature less than about −50 degrees Celsius. In another embodiment, which can be combined in other embodiments described herein, the cryogenic chiller 117 is a two-stage chiller that utilizes refrigerant internal to the two-stage chiller such the base fluid is maintained at the cryogenic temperature less than −50 degrees Celsius.

Figure 2:
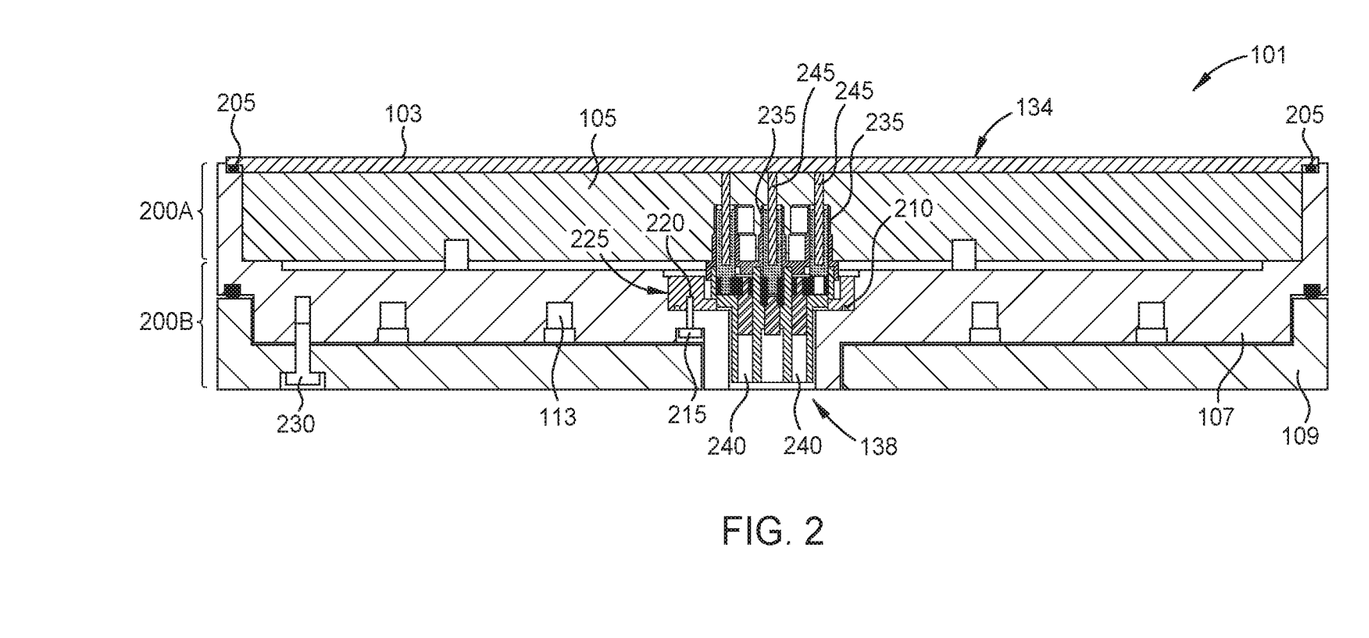
FIG. 2 is a schematic sectional view of a portion of an exemplary substrate support assembly according to an embodiment.

FIG. 2 is a schematic sectional view of a portion of an exemplary substrate support assembly 101 according to an embodiment. The substrate support assembly 101 is configured to enable cryogenic temperature operation of ESC 103 so that a substrate 124 (shown in FIG. 1) disposed thereon is maintained at the cryogenic processing temperature. The ESC base assembly 105, the facility plate 107 and the dielectric plate 109 are shown in FIG. 2. The ESC 103 is also shown coupled to the top surface 134 of the ESC base assembly 105. Also shown is the electrical connector 138 positioned in a geometric center of the substrate support assembly 101. It is contemplated that the electrical connector 138 may be positioned in another location.

During use, as described above, the ESC 103 and the ESC base assembly 105 are chilled by the cryogenic chiller 117 and the facility plate 107 is warmed by the heating fluid source 119. The substrate support assembly 101 is generally divided into two zones, such as a first zone 200A and a second zone 200B. The first zone 200A and the second zone 200B are characterized as different pressure regions. For example during processing of the substrate, the first zone 200A is maintained at negative or vacuum pressures while the second zone 200B is maintained at or near atmospheric or ambient pressures. A seal 205 prevents leakage between the first zone 200A and the second zone 200B. In another embodiment, the first zone 200A and the second zone 200B are characterized as different temperature regions, which may or may not be also characterized as different pressure regions. For example during processing of the substrate, the first zone 200A is maintained at a first temperature while the second zone 200B is maintained at a second temperature. The first temperature is lower than the second temperature. In one example, the first zone 200A is maintained at cryogenic temperatures while the second zone 200B is maintained at or near ambient temperatures or much higher than cryogenic temperatures. Examples of the first temperature includes about −10 degrees Celsius to about −150 degrees Celsius, including down to about −200 degrees Celsius. Examples of the second temperature includes above about 0 degrees Celsius to about 20 degrees Celsius, including up to about 25 degrees Celsius.

The electrical connector 138 functions in one aspect to maintain the pressures within the first zone 200A and the second zone 200B. A seal 210 interfaced between the facility plate 107 and the electrical connector 138 to maintain isolation of the pressures within the first zone 200A and the second zone 200B. The seal 210 may be any suitable seal or gasket, such as an O-ring type, cup seal, lip seal, or gasket, among others. The seal 210 made fabricated from a polymeric, elastomeric material or other suitable material.

The electrical connector 138 is coupled to the ESC base assembly 105 by a plurality of fasteners 215 (only one is shown in this view), such as a screw or bolt. Each fastener 215 is received in a threaded hole 220 formed in a body 225. The dielectric plate 109 is coupled to the facility plate 107 by one or more fasteners 230 (only one is shown in this view), such as a screw or bolt.

The electrical connector 138 includes a plurality of upper or first sockets 235 and a plurality of lower or second sockets 240. Each of the first sockets 235 and the second sockets 240 are configured as female electrical connector interfaces. Each of the first sockets 235 are configured to receive pins 245 of electrical lines coupled to either of the resistive heaters 128 (shown in FIG. 1) or the chucking electrode 126 (shown in FIG. 1) of the ESC 103. Each of the second sockets 240 are configured to receive a pogo pin type connector (not shown) or other suitable electrical connector coupled to either the heater power source 136 or the chucking power source 135 (both shown in FIG. 1).

Figure 3:
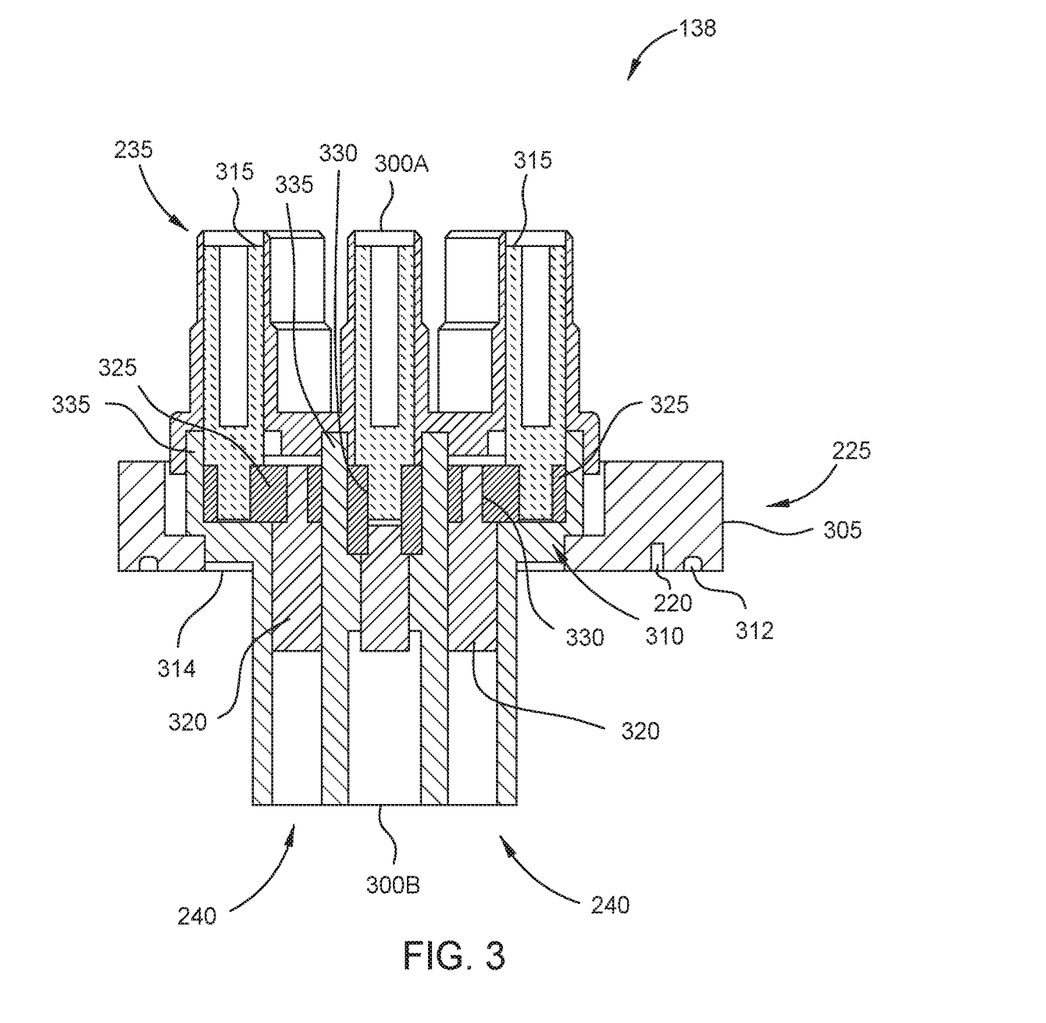
FIG. 3 is a sectional view of the electrical connector according to an embodiment along lines 3-3 of FIG. 5.

FIG. 3 is a sectional view of the electrical connector 138 as disclosed herein. The electrical connector 138 includes an upper or first interface body 300A and a lower or second interface body 300B opposing the first interface body 300A. The first interface body 300A and the second interface body 300B are coupled to each other. The second interface body 300B is coupled to an intermediate or third interface body 305.

A portion of the electrical connector 138 is disposed in the first zone 200A (shown in FIG. 2) and another portion of the electrical connector 138 is disposed in the second zone 200B (shown in FIG. 2). For example, the first interface body 300A and the third interface body 305 are positioned in the first zone 200A while the second interface body 300B is positioned in the second zone 200B (with respect to pressure). In one embodiment, the first interface body 300A and the third interface body 305 are a vacuum portion of the electrical connector 138 while the second interface body 300B is an atmospheric or ambient portion of the electrical connector 138.

In FIG. 3, at least two second sockets 240 and three first sockets 235 are shown in cross-section, while two first sockets 235 are at least partially visible behind the cross-sections of the three first sockets 235. Each of the first sockets 235 are formed in the first interface body 300A and each of the second sockets 240 are formed in the second interface body 300B. Each of the first interface body 300A and the second interface body 300B are fabricated from dielectric materials to electrically insulate a plurality of conductive electrical unions 310 disposed between the first interface body 300A and the second interface body 300B. In one example, the first interface body 300A is fabricated from a polymer material, such as thermoplastic material, for example a polyether ether ketone (PEEK) material. In another example, the second interface body 300B is fabricated from high dielectric constant material, such as a ceramic material, for example aluminum oxide. The third interface body 305 may be fabricated from a metallic material, such as titanium. A seal groove 312, for receiving the seal 210 (shown in FIG. 2), is formed in a lower surface 314 of the third interface body 305. Each of the first interface body 300A and the second interface body 300B may be brazed, potted or otherwise coupled to the third interface body 305. The ceramic material of the second interface body 300B facilitates thermal insulation. The ceramic material of the second interface body 300B also facilitates brazing in order to couple the electrical connector 138 together.

The connection between the third interface body 305 and the second interface body 300B is a relatively small surface to surface contact. This may provide a thermal choke to help isolate the seal 210 from the colder ESC 103. Also, the connection between the first interface body 300A and the second interface body 300B, and the third interface body 305 coupled to the back of the second interface body 300B may also help thermally isolate the seal 210.

Each conductive electrical union 310 includes upper or first electrical terminals 315, lower or second electrical terminals 320 and connecting tabs 325. Each of the first electrical terminals 315 extend from the conductive electrical union 310 into the first sockets 235, and each of the second electrical terminals 320 extend from the conductive electrical union 310 into the second sockets 240. The conductive electrical union 310 also includes a plurality of connecting tabs 325. One of the connecting tabs 325 is disposed between each pair of the first electrical terminals 315 and the second electrical terminals 320. The connecting tab 325 is an electrically conductive metal coupled to and/or at least partially surrounding each of the first electrical terminals 315 and the second electrical terminals 320. Separate connecting tabs 325 provide the electrically connection within the electrical connector 138 between each pair of first and second electrical terminals 315, 320. Some of the connecting tabs 325 extend laterally so that the centerlines of mating electrical terminals 315, 320 do not have to be aligned. This allows the pitch of first electrical terminals 315 to be different than the pitch of the electrical terminals 320. In the example depicted herein, the pitch of first electrical terminals 315 is greater than the pitch of the electrical terminals 320, thus allowing the second sockets 240 to be arranged more densely and take up less space than first sockets 235.

The first electrical terminals 315, the second electrical terminals 320 and the connecting tab 325 are made from electrically conductive materials suitable of efficient electrical transmission. Examples of conductive materials include molybdenum (Mo), copper (Cu), or other electrically conductive metals. The electrically conductive metals may be coated with another electrically conductive metal, such as silver (Ag) or gold (Au). In a specific example, the first electrical terminals 315 are Cu coated with Ag, the second electrical terminals 320 are Mo, and the connecting tabs 325 is Cu.

One or both of the first electrical terminals 315 and the second electrical terminals 320 may be coupled to the connecting tab 325 by brazing, or by a threaded connection 330. The second interface body 300B includes protruding sidewalls 335 that separate the connecting tabs 325 and into the first interface body 300A. The protruding sidewalls 335 provide electrical insulation between the different connecting tabs 325 coupling each pair of each pair of first and second electrical terminals 315, 320 so that electrical breakdown and shorting are substantially prevented. The protruding sidewalls 335 also electrical separates adjacent electrical paths (e.g., first electrical terminals 315 electrically connected by the connecting tab 325 to respective second electrical terminals 320)

Figure 4:
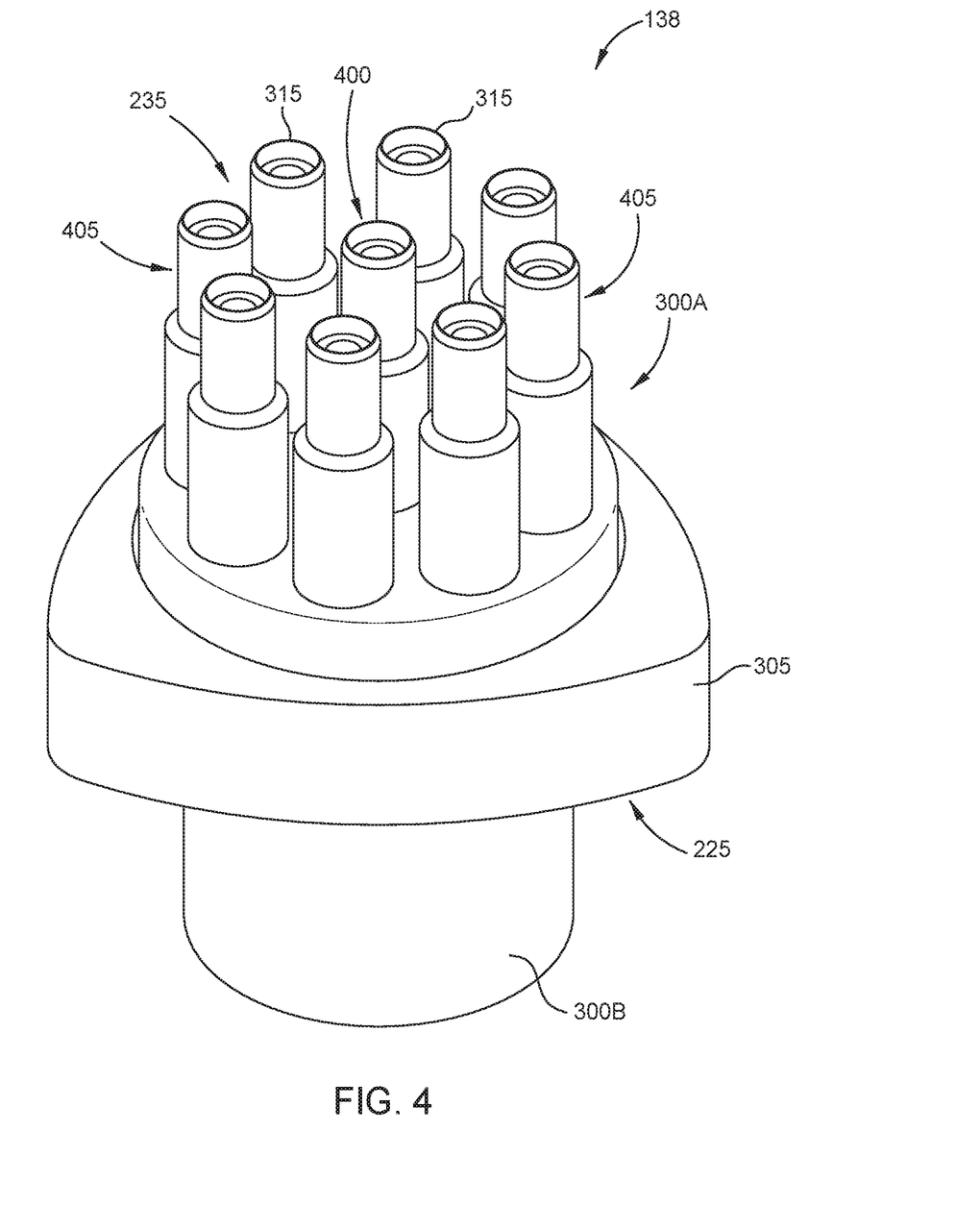
FIG. 4 is an isometric view of the electrical connector as disclosed herein.
Figure 5:
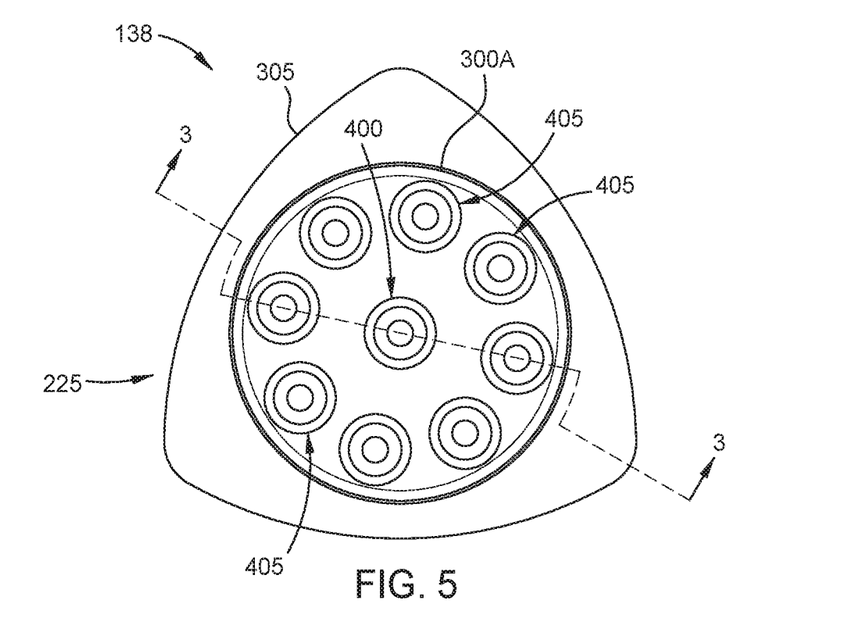
FIG. 5 is a top plan view of the electrical connector.

FIG. 4 is an isometric view of the electrical connector 138 as disclosed herein. FIG. 5 is a top plan view of the electrical connector 138 and FIG. 6 is a bottom plan view of the electrical connector 138.

Figure 6:
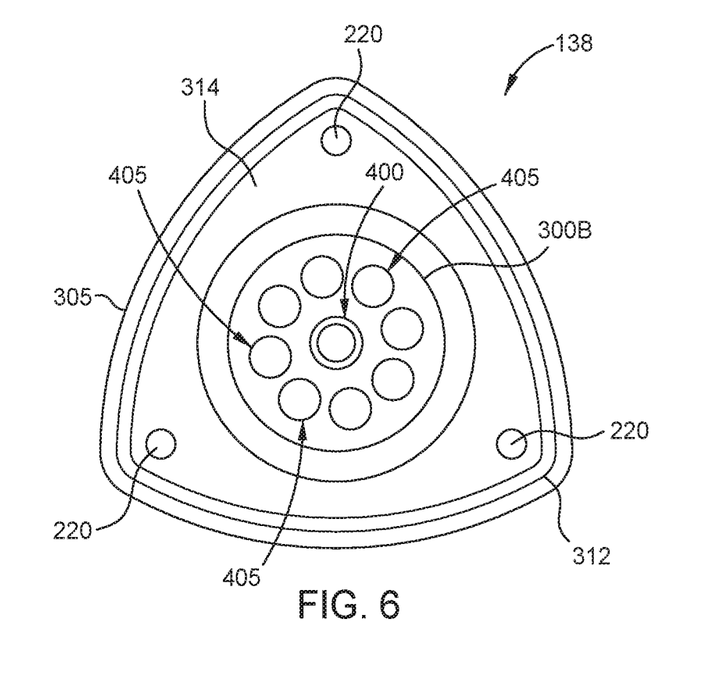
FIG. 6 is a bottom plan view of the electrical connector.

Shown in FIGS. 4, 5 and 6 is a central terminal set 400 surrounded by a plurality of peripheral terminal sets 405. Each of the central terminal set 400 and the peripheral terminal sets 405 comprises a separate electrical path through a paired first and second electrical terminals 315, 320. The central terminal set 400 comprises one of the first electrical terminals 315 that is electrically connected to one of the second electrical terminals 320 by one of the connecting tabs 325. Likewise, each of the plurality of peripheral terminal sets 405 comprises one of the first electrical terminals 315 that is electrically connected to one of the second electrical terminals 320 by one of the connecting tabs 325. Thus, nine separate electrical paths (one central terminal set 400 and eight peripheral terminal sets 405) are shown in FIGS. 5 and 6.

The central terminal set 400 is coupled to the chucking electrode 126 (shown in FIG. 1) of the ESC 103. At least a portion of the peripheral terminal sets 405 are dedicated to heater elements of the resistive heaters 128 (shown in FIG. 1). One of the peripheral terminal sets 405 may be coupled to ground.

The electrical connector 138 as described herein provides a current of up to about 25 amps during operation at a temperature range of about 20 degrees Celsius to about −60 degrees Celsius. The electrical connector 138 as described herein provides a voltage standoff (breakdown voltage) of about 7 kilo Volts (kV) between the various electrical paths as well as between the electrical paths and the interface bodies (e.g., first interface body 300A, second interface body 300B and third interface body 305). This reduces arcing within the substrate support assembly 101. The electrical connector 138 as described herein provides suitable vacuum sealing up to and including pressures of about $10^{-3}$ Torr (e.g., about 0.0001934 pounds per square inch (psi)) during operation. Further, the electrical connector 138 as described herein provides an electrical and sealing interface during operation including the above using a standard polymer or elastomeric seal 210.

While the foregoing is directed to examples of the present disclosure, other and further examples of the disclosure may be devised without departing from the basic scope thereof, and the scope thereof is determined by the claims that follow.

What is claimed is:

1. An electrical connector, comprising:
    a first interface body having first sockets; and
    a second interface body having second sockets, the second interface body coupled to the first interface body and to a third interface body, the second interface body and first interface body circumscribed by the third interface body, wherein each of the first interface body and the second interface body are brazed or potted to the third interface body, and wherein each of the first interface body and the second interface body comprise:
    a plurality of electrical terminals disposed in the first sockets and the second sockets, each electrical terminal disposed in the first sockets of the first interface body coupled to a respective one of the electrical terminals disposed in the second sockets of the second interface body to form a plurality of isolated conductive electrical unions, wherein a first opening of the first sockets are facing in a direction opposite and away from a second opening of the second sockets, wherein a centerline of at least one of the second sockets is parallel and offset from a centerline of, and electrically coupled to, a paired one of the first sockets, and wherein the second interface body includes a plurality of non-conductive protruding sidewalls that extend into the first interface body between each pair of the electrical terminals of the first interface body, and wherein the third interface body includes a seal groove formed in a bottom surface thereof that faces away from the first interface body.

2. The electrical connector of claim 1, wherein the first sockets of the first interface body are less densely located than the second sockets in the second interface body.

3. The electrical connector of claim 1, wherein the conductive electrical unions includes connecting tabs coupling the electrical terminals.

4. The electrical connector of claim 3, wherein the electrical terminals in the first interface body and the connecting tabs comprise a first metallic material, and the electrical terminals in the second interface body comprises a second metallic material different than the first metallic material.

5. The electrical connector of claim 3, wherein the non-conductive protruding sidewalls electrically separates the connecting tabs from each other.

6. The electrical connector of claim 1, wherein at least one of the electrical terminals comprises a threaded portion for coupling with a connecting tab disposed in the conductive electrical unions.

7. The electrical connector of claim 1, wherein the third interface body includes a plurality of threaded holes.

8. The electrical connector of claim 1, wherein the first interface body comprises a first dielectric material and the second interface body comprises a second dielectric material.

9. The electrical connector of claim 8, wherein the third interface body comprises an electrically conductive material.

10. A substrate support assembly comprising:
    an electrostatic chuck;
    a base assembly coupled to the electrostatic chuck;
    a facility plate coupled to the base assembly; and
    an electrical connector positioned in a center of the base assembly in electrical communication with the electrostatic chuck, wherein the electrical connector comprises:
    a first interface body comprising a first dielectric material and having first sockets; and
    a second interface body comprising a second dielectric material different than the first dielectric material and having second sockets, the second interface body coupled to the first interface body and circumscribed by a third interface body, wherein each of the first interface body and the second interface body are brazed or potted to the third interface body, and wherein each of the first interface body and the second interface body comprise:
    a plurality of electrical terminals disposed in first sockets and the second sockets formed in the respective first and second interface bodies, each of the plurality of electrical terminals coupled together by a plurality of conductive electrical unions formed in the third interface body and portions of the sockets, wherein a first opening of the first sockets are facing in a direction opposite and away from a second opening of the second sockets, and wherein a centerline of at least one of the second sockets is from offset and parallel to a centerline of, and electrically coupled to, a paired one of the first sockets.

11. The substrate support assembly of claim 10, wherein the second interface body includes a plurality of protruding sidewalls that extend into the first interface body between each pair of the electrical terminals, wherein the protruding sidewalls are non-conductive.

12. The substrate support assembly of claim 10, wherein the third interface body includes an O-ring groove formed in a bottom surface thereof for receiving a vacuum seal.

13. The substrate support assembly of claim 10, wherein the conductive electrical unions includes a connecting tab.

14. The substrate support assembly of claim 13, wherein the electrical terminals in the first interface body comprise a first metallic material, and the electrical terminals in the second interface body comprises a second metallic material different than the first metallic material.

15. The substrate support assembly of claim 13, wherein the protruding sidewalls are non-conductive and electrically separates a portion of the connecting tab.

16. The substrate support assembly of claim 10, wherein each of the electrical terminals comprises a threaded portion for coupling with an connecting tab disposed in the conductive electrical unions.

17. A substrate support assembly disposed in a plasma processing system, the substrate support assembly comprising:
an electrostatic chuck having a chucking electrode and a plurality of heaters;
a base assembly coupled to the electrostatic chuck;
a facility plate coupled to the base assembly; and
an electrical connector coupled to the facility plate in electrical communication with the electrostatic chuck, wherein the electrical connector comprises:
a first interface body having first sockets; and
a second interface body having second sockets, the second interface body coupled to the first interface body and circumscribed by a third interface body, wherein each of the first interface body and the second interface body are brazed or potted to the third interface body, and wherein each of the first interface body and the second interface body comprise:
a plurality of electrical terminals disposed in the first sockets and the second sockets formed in the respective first and second interface bodies, each of the plurality of electrical terminals coupled together by a plurality of conductive electrical unions formed in the third interface body and portions of the sockets, wherein a first opening of the first sockets are facing in a direction opposite and away from a second opening of the second sockets, and wherein a centerline of at least one of the second sockets is offset from and parallel to a centerline of, and electrically coupled to, a paired one of the first sockets, wherein the second interface body includes a plurality of protruding non-conducting sidewalls that extend into the first interface body between each pair of the electrical terminals, and wherein the third interface body includes an O-ring groove formed in a bottom surface thereof.

18. The substrate support assembly of claim 17, wherein the first interface body and the third interface body comprise a first section at a vacuum environment and the second interface body comprises a second section at an atmospheric environment.

19. The substrate support assembly of claim 17, wherein the conductive electrical unions includes a connecting tab.

20. The substrate support assembly of claim 19, wherein the electrical terminals in the first interface body comprise a first metallic material, and the electrical terminals in the second interface body comprises a second metallic material different than the first metallic material.

* * * * *